Oct. 2, 1962 H. J. HUBER ET AL 3,056,317

ARTICLE MANIPULATING AND PROCESSING APPARATUS

Filed Sept. 2, 1959

INVENTORS
H. J. HUBER
R. F. LIPSCOMB
By S. Gundersen
ATTORNEY 3,056,317
Patented Oct. 2, 1962

3,056,317

ARTICLE MANIPULATING AND PROCESSING APPARATUS

Henri J. Huber and Robert F. Lipscomb, Reading, Pa., assignors to Western Electric Company, Incorporated, a corporation of New York Filed Sept. 2, 1959, Ser. No. 837,608
5 Claims. (Cl. 78—82)

The present invention relates to article manipulating and processing apparatus and more particularly to apparatus for transporting and gas immersing small fragile articles as may be utilized in the pressure bonding of semi-conductor devices.

In the fabrication of some types of semi-conductive devices it is necessary to produce a contact between the body of semi-conductive material, called a "wafer" and the conductive base, called a "header." For example, in one type of transistor, the "mesa transistor," it is necessary to bond the bottom of a semi-conductive wafer to a header, prior to bonding the wire electrode leads to the top of the wafer.

It is an object of this invention to provide a simple inexpensive device for lifting, transporting, pressure bonding, and gas enveloping of articles.

It is a further object of this invention that such functions be performed under simple and exact external control.

In accordance with the invention a vacuum line and a gas pressure line lead through individual valves to a single thin needle having a slotted end. The needle may be readily handled by an operator or light duty automatic machinery. In using the device for a wafer positioning and bonding operation, the operator contacts a wafer having a substantially flat face, by vacuum suction lifts the wafer with the end of the needle, positions the wafer on the header, releases the vacuum suction, holds down the wafer with the needle, and flows gas onto the wafer for cooling, the wafer being held in contact with the header by pressure exerted through the needle while heat is applied to the header to bond the wafer thereto.

Other objects are apparent from the following detailed description, taken in conjunction with the accompanying drawings in which.

Figure 1:
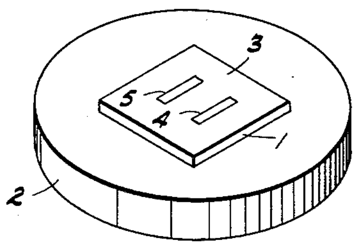
FIG. 1 is a perspective view of the wafer bonded to the header.

With reference to the drawing, in FIG. 1, wafer 1 consists of a semi-conductive material, such as highly purified silicon or germanium two hundredths of an inch on each side and thre thousandths of an inch thick. Wafer 1 is mounted on header 2 which is made of a nickel-iron alloy plated with gold and is about three-tenths of an inch in diameter. FIG. 1, for clarity, is not in scale. Deposited about one thousandth of an inch from each other on the flat top surface 3 of wafer 1 are aluminum stripe 4 and gold stripe 5. Gold stripe 5 forms an ohmic contact with surface 3 and provides contact for a gold electrode wire applied in a subsequent step. Aluminum stripe 4 forms a rectifying electronic junction with surface 3.

Wafer 1 is adhered to header 2 through pressure and heat bonding. Although the pressure applied to wafer 1 is only one ounce, due to the small size of wafter 1, this pressure amounts to about one hundred and fifty pounds per square inch. At the same time pressure is applied onto wafer 1, heat, of 300° to 400° centigrade, is applied to header 2 from a source of current 21 passing through conductors 22 to an electrical resistance heater 23 upon which the header rests. Without external cooling, gold stripe 5 diffuses into wafer 1 under such heat and pressure. When heat is supplied to the bonding area to effectuate the bond, the temperature of wafer 1 is raised sufficiently to diffuse gold stripe 5 into the wafer. This diffusion (or alloying) of gold into the semi-conductive wafer changes the electrical properties of the wafer to such an extent that any resulting transistor would be unsatisfactory and rejected. The heat, although small in absolute terms, is sufficient so that the entire gold stripe 5 may diffuse into wafer 1.

Figure 2:
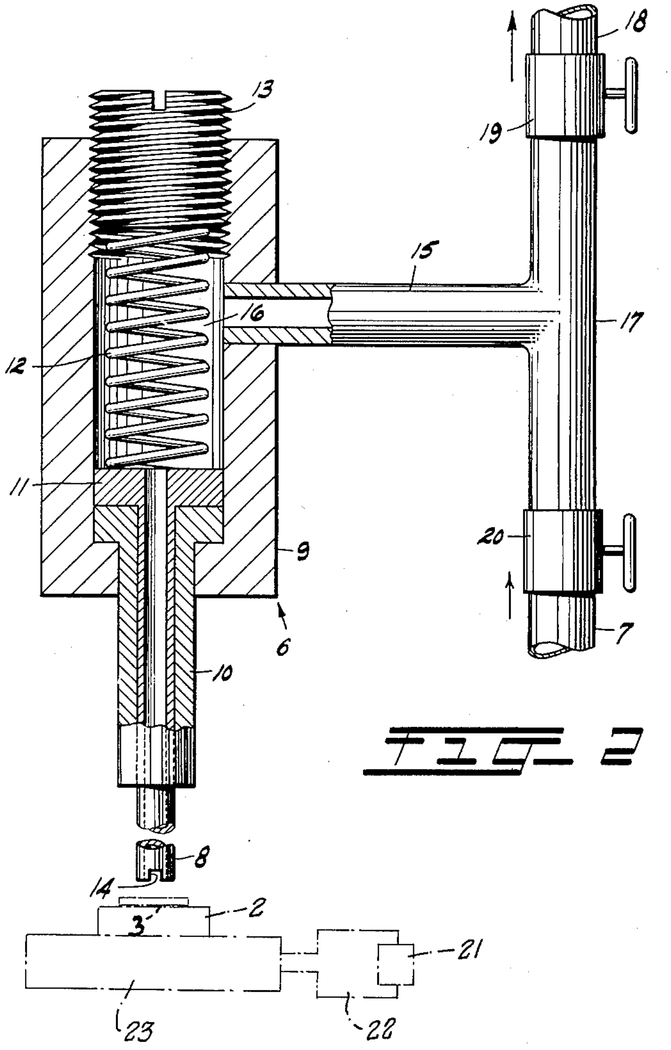
FIG. 2 is a side cut-away view of the device, valves, and associated gas and suction lines.

In FIG. 2 device 6 eliminates diffusion of gold stripe 5 into wafer 1 by continuously cooling the top surface of the wafer with a flow of gas from gas pressure or supply line 7 during the bonding operation. Device 6 contains a thin stainless steel needle 8 having an outside diameter of .02 inch and an inside diameter of .01 inch. Needle 8 is held in holder 9, designed to be held by an operator or by a controlled machine. As shown in FIG. 2 a tube 10 fixes needle 8 in holder 9. Needle 8 slides in the barrel of tube 10 with needle shoulder 11 in the barrel 16 of holder 9. Shoulder 11 is in contact with a compressible supporting spring 12 having a .01 diameter and serving as a safety device for the pressure exerted by tube 10. Barrel 16 of holder 9 is closed by adjustable screw plug 13. Turning of plug 13 increases or decreases the tension upon spring 12 and hence the minimum pressure under which needle 8 will slide up into holder 9. If the operator, or machine, applies pressure above the predetermined maximum to wafer 1 through device 6, needle 8 slides into the barrel 16 of holder 9 further compressing the spring thereby preventing any excess pressure on the wafer.

At its bottom, needle 8 has a transverse square U-shaped slot 14 serving as a gas orifice. Slot 14 is sufficiently large so that the arms of the U-shaped slot 14 in needle 8 are applied outside the area covered by stripes 4 and 5. One end of a hollow line 15 leads through a wall of holder 9 into barrel 16. The other end of line 15 branches in a T at point 17 into gas line 7 and suction line 18. Lines 7 and 18 have individual valves 20 and 19, respectively. These valves may be hand operated or operated by automatic means such as solenoids or cams. The suction applied through line 18 is a partial vacuum equivalent to that vacuum sufficient to draw three inches of water. This small suction is sufficient to lift wafer 1, despite the partial los of suction through the entrance of air through slot 14. The gas used is a forming gas consisting of 92% nitrogen and 8% hydrogen at a pressure of about 5 to 15 pounds per square inch above atmospheric pressure (a flow of a few cubic feet per hour).

In operation, the operator, with valves 19 and 20 both closed, contacts the end of needle 8 to the top surface 3 of wafer 1 at a wafer supply station. Valve 19 is opened and the wafer adheres, by suction, to the end of needle 8. Wafer 1 is transported to a position above header 2 and deposited and located on the header. Slight pressure is exerted on wafer 1 by needle 8. Valve 19 is closed and valve 20 is opened. Cooling gas then flows through line 7, line 15, barrel 16, needle 8, out of slot 14 and over wafer surface 3. Pressure is applied to device 6, and through needle 8 to wafer 1, while the header is heated thereby bonding wafer 1 to header 2. Device 6 is removed from wafer 1 and valve 20 closed, readying the device to repeat the process.

Modifications may be made in the present invention within its scope, such as utilizing a heated gas to join components requiring low temperature heat for bonding where cooling is not required as in soldering together small metal parts.

What is claimed is:

1. In apparatus for attaching an element to an article, a hollow needle, suction means connected to said needle for holding the element at the pick-up end portion thereof while positioning the needle over the article, means connected to the needle for exerting pressure therethrough to the element against the article, means for heat bonding the element to the article, and cooling means for permitting the passage of a cool gas over at least a portion of the element during its bonding to the article to prevent any heat injury thereto, said cooling means being operable after a release of the suction means.

2. In apparatus according to claim 1 wherein the needle end portion has a slotted orifice properly sized for providing sufficient suction to hold the element.

3. In apparatus according to claim 1 wherein the configuration of the needle end portion is shaped such to permit the cool gas passing therethrough to envelop and cool the element during its bonding to the article.

4. In apparatus having means for bonding a semiconductive wafer to a header, a housing having a recessed portion therein, a hollow needle having one end secured within said recessed portion and the other end provided with a slotted orifice, line means connected through the housing and recessed portion to the needle for permitting the passage of a vacuum suction and cool gas therethrough, valve means connected to the line means for successively controlling the vacuum suction for holding the wafer at the slotted orifice during its positioning over the wafer and for cooling at least a portion of the wafer through said orifice while the wafer is being bonded to the header, and means for controlling the force exerted on the needle during the wafer bonding to the header.

5. In apparatus according to claim 4 wherein the controlling force means includes a resilient member extending within the recessed portion and whose lower end engages said one end of the needle, and a screw plug threadedly adjustable within the housing and in engagement with the other end of the resilient member for adjusting the tension thereon to minimize the pressure exerted on and movement of the needle within the recessed portion during the wafer bonding.

References Cited in the file of this patent

UNITED STATES PATENTS

| | | |
|---|---|---|
| 508,036 | Moxham | Nov. 7, 1893 |
| 760,600 | Allen | May 24, 1904 |
| 1,451,610 | Gestas | Apr. 10, 1923 |
| 1,502,120 | Rasmussen | July 22, 1924 |
| 2,125,480 | Avery | Aug. 2, 1938 |
| 2,427,712 | Casler | Sept. 23, 1947 |
| 2,815,689 | Barnes | Dec. 10, 1957 |
| 2,858,597 | Kraemer | Nov. 4, 1958 |
| 2,923,183 | Johnson | Feb. 2, 1960 |
| 2,979,228 | Englert | Apr. 11, 1961 |